United States Patent [19]

Geer et al.

[11] Patent Number: 5,079,725
[45] Date of Patent: Jan. 7, 1992

[54] CHIP IDENTIFICATION METHOD FOR USE WITH SCAN DESIGN SYSTEMS AND SCAN TESTING TECHNIQUES

[75] Inventors: Charles P. Geer; David W. Marquart, both of Rochester, Minn.

[73] Assignee: IBM Corporation, Rochester, Minn.

[21] Appl. No.: 438,746

[22] Filed: Nov. 17, 1989

[51] Int. Cl.[5] ............................................. G06F 13/00
[52] U.S. Cl. ...................................... 364/550; 371/223
[58] Field of Search ........................ 364/550; 371/22.3

[56] References Cited

U.S. PATENT DOCUMENTS

| | | | |
|---|---|---|---|
| 3,705,385 | 12/1972 | Batz | 340/870.02 |
| 3,761,695 | 9/1973 | Eichelberger | 371/22.3 |
| 3,783,254 | 1/1974 | Eichelberger | 364/700 |
| 3,784,907 | 1/1974 | Eichelberger | 324/617 |
| 4,064,486 | 12/1977 | Faber | 370/85.15 X |
| 4,268,902 | 5/1981 | Berglund et al. | 364/200 |
| 4,276,644 | 6/1981 | DeWitte | 340/870.22 X |
| 4,293,919 | 10/1981 | Dasgupta et al. | 364/716 |
| 4,298,980 | 11/1981 | Hajdu et al. | 371/22.3 |
| 4,493,077 | 1/1985 | Agrawal et al. | 371/22.3 |
| 4,519,078 | 5/1985 | Komonytsky | 371/22.3 |
| 4,649,266 | 3/1987 | Eckert | 364/464.02 X |
| 4,710,931 | 12/1987 | Bellay et al. | 371/22.3 |
| 4,750,168 | 6/1988 | Trevitt | 370/85.7 |

FOREIGN PATENT DOCUMENTS 58-3256 1/1983 Japan .

OTHER PUBLICATIONS

Bergland, N. C., "Processor Development in the LSI Environment", Electronics, Mar. 15, 1979, McGraw-Hill, Inc., 1979.
"A Proposal for an IBM Testability Bus Standard", Version 2.0, by Joint Test Action Group (JTAG), Jul. 27, 1988, pp. 1-74.

Primary Examiner—Parshotam S. Lall
Assistant Examiner—Edward R. Cosimano
Attorney, Agent, or Firm—Joan Pennington; J. Michael Anglin; Bradley A. Forrest

[57] ABSTRACT

A method and apparatus are provided for uniquely identifying integrated circuit chips adapted for use with scan design systems and scan testing techniques. A predetermined identification number corresponding to each LSI chip to be identified is assigned. Each predetermined identification number has a predefined format. The assigned identification number is stored in a plurality of predefined shift register latches (SRLs) in the corresponding LSI chip to be identified. Then the LSI chip is identified by selectively reading out the stored predetermined identification number.

13 Claims, 2 Drawing Sheets

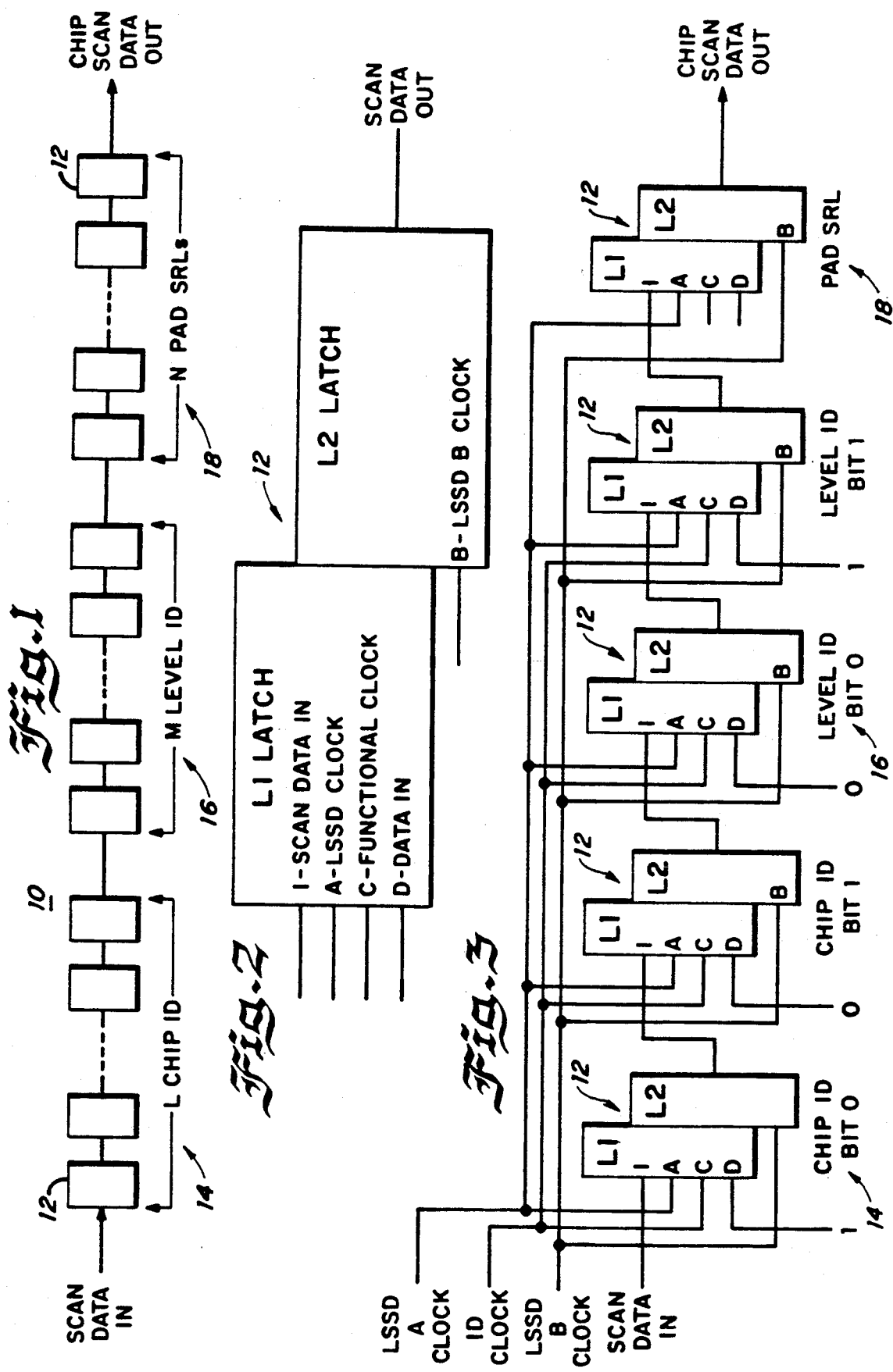

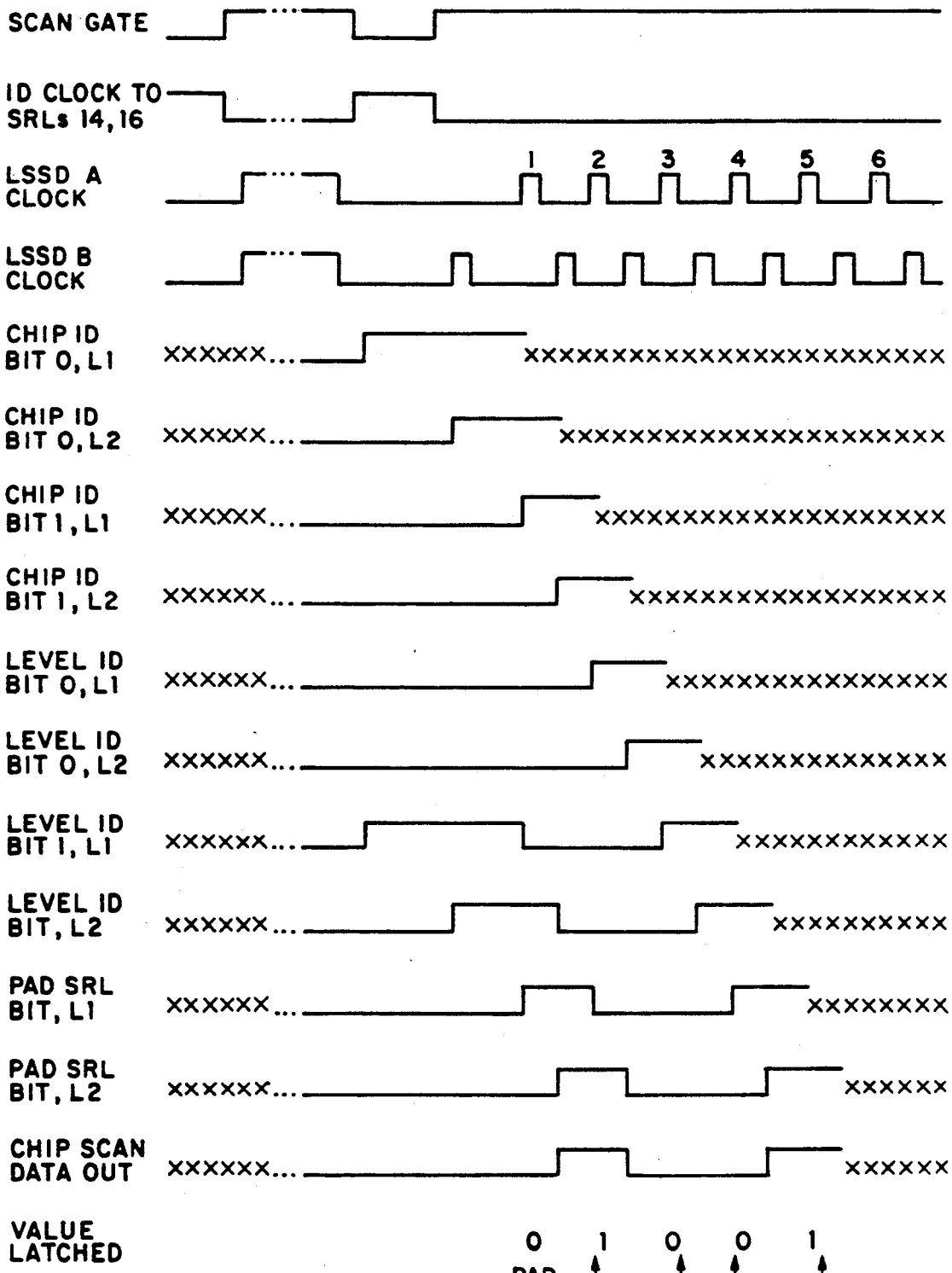

CHIP IDENTIFICATION METHOD FOR USE WITH SCAN DESIGN SYSTEMS AND SCAN TESTING TECHNIQUES

BACKGROUND OF THE INVENTION

1. Field of the Invention

The present invention relates to an integrated circuit chip identification method and more particularly to an integrated circuit chip identification method adapted for use with a Level Sensitive Scan Design (LSSD) system and testing technique of the type disclosed and defined in U.S. Pat. Nos. 3,783,254, 3,761,695, 3,784,907 and 4,268,902 and of common assignee and other scan design methodologies.

2. Description of the Prior Art

Due to the complexity and the extremely great number of circuit functions contained on a single large scale integrated (LSI) device or chip, the LSSD system and testing technique has been widely used. LSSD requires that all latches be connected together in a shift register or scan ring for testing and this methodology allows patterns to be shifted (scanned) into and out of all latches in the design.

U.S. Pat. No. 4,268,903 issued May 19, 1981 and of common assignee discloses the LSSD system and testing technique and a computer system including a maintenance interface compatible with LSSD design for synchronizing the operation of a service processor and a central processing unit. The disclosure of U.S. Pat. No. 4,268,902 is incorporated herein by reference.

U.S. Pat. Nos. 4,293,919, 4,298,980 and 4,493,077 provide examples of LSI circuitry generally conforming to LSSD system rules and scan ring testing methods.

U.S. Pat. No. 4,519,078 discloses a method of self-testing LSI circuits that incorporates internally generated pseudorandom sequences as test vectors to stimulate the logic circuits under test. Responses inside the chip to the test vectors are analyzed by internal or external signature analysis to determine if the circuit has functioned properly.

U.S. Pat. No. 4,710,931 discloses a test partitionable logic circuit including a plurality of functional modules. Each of the functional modules is addressable through an address decode/select circuit to operationally isolate the select modules and define a test boundary so that a separate test pattern can be generated for each module and each module can be tested separate from each other module, reducing both the time to complete a total test of the system and also the time for generating the test pattern.

An accurate chip identification is needed to facilitate self-test data selection because the exact logic structure of a particular chip is required for proper self-test data selection. Small changes in the logic structure in a chip that do not affect the microcode loads cause failures in self-testing. However, no mention of any mechanism for chip identification is provided by the above patents.

Japanese patent application publication No. 58-3252 discloses an LSI chip having an identification code pattern representing the logic structure of an IC formed in the LSI chip. A set of external pins or terminals are provided with the LSI chip for reading the identification code pattern from the LSI chip in parallel form. While the identification code pattern formed in the chip facilitates automated testing, this approach is not practical due to the required external terminals that must be provided to access the identification code pattern. The number of bits that can be used to define the identification code pattern is limited by the number of external terminals available for the chip.

SUMMARY OF THE INVENTION

Important objects of the present invention are to provide a method and apparatus for uniquely identifying integrated circuit chips and adapted for use with scan design systems and scan testing techniques and scan design methodologies; to provide such a chip identification method and apparatus that does not require any additional chip pins or special changes in the integrated circuit chips; and to provide such a chip identification method and apparatus that facilitates efficient and reliable chip and chip-level identification utilizing the LSSD scan ring of the chip.

In brief, the objects and advantages of the present invention are achieved by a method and apparatus for uniquely identifying integrated circuit chips adapted for use with scan design systems and scan testing techniques. A predetermined identification number corresponding to each LSI chip to be identified is assigned. Each predetermined identification number has a common predefined format. The assigned predetermined identification number is stored in a plurality of predefined shift register latches (SRLs) in the LSI chip to be identified. The LSI chip is identified by selectively reading out the stored predetermined identification number.

BRIEF DESCRIPTION OF THE DRAWINGS

The present invention together with the above and other objects and advantages may best be understood from the following detailed description of the embodiment of the invention illustrated in the drawings, wherein:

FIG. 1 is a block diagram representation of a portion of a LSSD shift register scan ring with which the method the present invention can be used;

FIG. 2 is a block diagram illustrating a typical latch of the type used in the LSSD shift register scan ring portion of FIG. 1;

FIG. 3 is a block diagram representation illustrating an exemplary stored integrated circuit identification number; and FIG. 4 is a timing diagram illustrating the control signals which may be employed in the method of the invention for retrieving the stored chip identification number illustrated in FIG. 3.

DETAILED DESCRIPTION OF THE PREFERRED EMBODIMENT

Referring now to FIG. 1, there is shown a block diagram representation of an end portion of a LSI scan ring generally designated by the reference numeral 10 for illustrating a method for uniquely identifying integrated circuit chips in accordance with the present invention. While the integrated circuit chip identification method is illustrated and described with reference to an LSSD implementation, it should be understood that the present invention advantageously can be used with various other scan design methodologies that allow patterns to be scanned into and out of the latches in the design.

A shift register latch (SRL) designated by the reference numeral 12 provides a single storage element with multiple SRLs 12 included in the scan ring portion 10. A predetermined identification number is assigned corresponding to each LSI chip in a particular system to be identified. LSI scan ring portion 10 includes a plurality of predefined shift register latches (SRLs) generally designated 14 and 16 used for storing the predetermined identification number in the LSI chip to be identified. Each predetermined identification number has a common predefined format including a predefined number L of chip identification (ID) bits stored in the SRLs 14 and a predefined number M of level ID bits stored in the SRLs 16.

A particular number of chip ID bits L and level ID bits M, respectively, is used as is needed to uniquely identify each LSI chip in the particular system. Preferably either an all logical zero or an all logical one bit pattern is reserved as an error indication and is not used to identify the chip ID or the level ID. For example, with L equal to six bits and avoiding identification numbers of all logical zeroes (000000) and all logical ones (111111), ($2^6-2$) or 62 different chip ID bit patterns are provided. Similarly for example, with M equal to four bits and avoiding identification numbers of all logical zeroes (0000) and all logical ones (1111), ($2^4-2$) or 14 different level ID bit patterns are provided.

A fixed number N of pad SRLs 18 is provided to separate the predetermined identification number from the end of the scan ring 10 indicated at a line labelled chip scan data output (SDO). Providing the fixed location of the SRLs 14 and 16 facilitates selectively reading out and identifying the fixed number N of bit-shifts required to locate the stored preselected number L and M bits defining the identification number to identify the LSI chip. The pad SRLs 18 can have any functional purpose as desired for a particular integrated circuit chip.

With a number of LSI chips to be identified in a system, a particular chip having the smallest number of SRLs 12 determines the maximum value of the number N pad bits allowable. The total of L+M+N must be less than or equal to the number of SRLs 12 in the chip with the smallest number of SRLS in a system of chips to be identified.

In FIG. 2, a schematic diagram illustrates a typical shift register latch (SRL) 12 of the type used as a single storage element with LSSD technique. Referring also to FIG. 3, each SRL 12 consists of a pair of polarity hold (type D) latches L1 and L2 with the output of the first L1 latch applied to an input of the second L2 latch. The L1 latch is used as a functional storage element. The L2 latches are used to store old values, or the current values, while the L1 latches store the new or next values. Also the L2 latches can be used functionally independent of the L1 latches in some LSSD systems. One scan data input (SDI) is reserved to be connected to the output of a previous L2 latch on the chip to allow patterns to be shifted or scanned into and out of all latches in the design. LSSD requires that all of the SRLs 12 on the entire chip are connected together into a shift register or scan ring. All of the SRLs 12 are connected in series with the first L1 SDI connected to a chip pin SDI, the last L2 SDO connected to a chip SDO, and each other L2 SDO connected to another L1 SDI to define the scan ring.

An A clock input is used to clock data from the SDI into the L1 latch. The data input at a line D is the normal functional data input with a system clock C used to load data from this input. The chip identification number is stored in the chip by connecting the data input D high or to a logical one or low to a logical zero for each of the SRLs 14 and 16 to form a bit pattern of the predetermined identification number. A B clock input is used to clock data from the L1 latch into the L2 latch of the scan ring including the scan ring end portion 10. The output of the last L2 latch in the scan ring end portion 10 is connected to a chip output pin which is designated chip scan data out (SDO).

In FIG. 3 an exemplary stored integrated circuit identification number of 1001 is illustrated. L equal to two chip ID bits and M equal to two level ID bits is provided for illustration purposes; typically a larger number of bits L and M would be used for both the chip ID and level ID. As shown, a single pad SRL 18 is used or with N set equal to one. The number N of SRLs 18 can be zero or larger; however, the same number N of SRLs 18 must be common for all the integrated circuit chips to be identified in a particular system. Any desired signal, such as a variable signal or a constant high or low data input D can be applied to any of the pad SRLs 18 as desired for a particular chip since the fixed number N of pad SRLs 18 is only used to identify the required number of bit-shifts to access the stored identification number for the chip. The clock input C applied to the pad SRLs 18 need only conform to the LSSD requirement of being off during scanning.

Referring now to FIG. 4, there is shown a scan timing diagram illustrating the control signals which may be employed in the method of the invention for retrieving the stored chip identification number illustrated in FIG. 3. As shown, an initialization indicated at flush (1) is performed with a scan gate signal, the LSSD A Clock and LSSD B clock held to a logical one "1" and the SDI of latch L1 held at logical zero "0" in order to initialize all SRLs 12 on the chip to a zero state. During the flush (1) a zero is loaded to the L1 latch for each of the chip ID bits 0 and 1, the level ID bits 0 and 1 and the pad SRL bit. Before the zero state is loaded during the flush (1), an x is shown for each of the chip ID bits 0 and 1 and the level ID bits 0 and 1, where x represents an unknown state of either a zero or a one state.

It should be understood that the stored identification number can be retrieved without performing the initial flush indicated at flush (1). Sequential steps for retrieving the stored identification number can begin with the control signals illustrated at set ID (2).

At set ID (2) the scan gate signal is deactivated to 0 so that the functional ID clock in FIG. 3 is enabled. The enabled functional ID clock is applied to the SRLs 14 and 16 so that the fixed high or low data input applied to the L1 data input D is latched or loaded into the L1 latch of the SRLs 14 and 16. At set ID (2), a logical 1 is loaded to both the L1 latch of chip ID bit 0 and the level ID bit 1 with the L1 latch of chip ID bit 1 and the level ID bit 0 loaded with a logical 0, corresponding to the data input D shown in the example provided in FIG. 3. Then the scan gate signal again is activated so that the functional ID clock is deactivated or turned off.

Next at set L2 (3), the LSSD B clock is pulsed to load or copy the data from the L1 latch to the L2 latch. Activation of the B clock first is necessary to copy the chip and level ID data of the SRLs 14 and 16 from the L1 latch to the L2 latch. Otherwise if the A clock was activated first, then the chip and level ID data of the SRLs 14 and 16 would be discarded when the previous L2 data is transferred to L1 latch. At set L2 (3), the logical 1 is copied to the respective L2 latch from the L1 latch of chip ID bit 0, SRL 14 and the level ID bit 1, SRL 16 and the logical 0 is copied from the L1 latch of chip ID bit 1, SRL 14 and the level ID bit 0, SRL 16 to the respective L2 latch.

Scanning begins at Scan Out (4) and six bit cycles 1–6 are shown. During each bit cycle the A clock is activated to transfer or shift data from the previous L2 latch to the L1 latch and then the B clock is activated to copy the data from the L1 latch to the L2 latch. The stored identification number is shifted or scanned out at the chip SDO in the reverse order or from right to left as shown in FIG. 3. The chip SDO is sampled at the same time the A clock pulse is applied. At the first A clock pulse of bit cycle 1, the pad SRL L2 data or 0 is sampled at the chip SDO. While the data 0 is shown, the pad SRL L2 data value is arbitrary and can be considered an x or unknown state. At the second A clock pulse for bit cycle 2, the level ID bit 1 data or 1 is sampled at the chip SDO. Next at the third A clock pulse for bit cycle 3, the level ID bit 0 data or 0 is sampled at the chip SDO. Sampling of the chip SDO is continued until the entire stored identification number is read out including the chip ID bit 1 data or 0 at the fourth A clock pulse for bit cycle 4 and the chip ID bit 0 data or 1 at the fifth A clock pulse for bit cycle 5. At bit cycle 6, data from the previous SRL 12 to the chip ID bit 0 is read which is represented by x.

It should be understood that a defined extension system could be stored in the SRLs 14 and/or 16, for example, providing a unique code in the chip ID or level ID SRLs indicating the location of the SRLs to retrieve the stored identification number. Other techniques not using the scan gate signal can be employed for setting the SRLs 14 and 16. Various clock control techniques can be used for enabling the functional clock signal to load the fixed L1 SDI data to the SRLs 14 and 16.

While the invention has been described with reference to details of the illustrated embodiment, these details are not intended to limit the scope of the invention as defined in the appended claims.

We claim:

1. A method for uniquely identifying large scale integrated (LSI) circuit chips of the type conforming to scan design systems and testing techniques comprising the steps of:
   identifying a first chip ID number, said first chip ID number including a first predetermined number L of bits;
   identifying a second chip ID number, said second chip ID number including a second predetermined number M of bits;
   combining said first and second ID numbers to assign a unique predetermined identification number corresponding to each LSI chip to be identified;
   storing one said assigned predetermined identification number in a plurality of predefined shift register latches (SRLs) of a scan ring in each LSI chip to be identified; and
   selectively reading out said stored predetermined identification number to identify the LSI chip.

2. A method as recited in claim 1 wherein said plurality of predefined shift register latches (SRLs) in each LSI chip to be identified are located a predetermined number N of pad SRLs from a scan data output (SDO) of the LSI chip.

3. A method as recited in claim 2 wherein said step of selectively reading out said stored predetermined identification number to identify the LSI chip includes the steps of:
   detecting said predetermined number N of bit-shifts; said detected N bit-shifts corresponding to said pad SRLs from said SDO, and
   identifying said stored predetermined identification number responsive to said detected number N bit-shifts.

4. A method as recited in claim 1 wherein said step of storing said assigned predetermined identification number in a plurality of predefined shift register latches (SRLs) includes the steps of:
   identifying a predetermined number of pad shift register latches SRLs disposed between said predefined shift register latches (SRLs) in each LSI chip to be identified and a scan data output (SDO) of the LSI chip; and
   applying a signal to set each of said predefined shift register latches (SRLs) corresponding to said assigned predetermined identification number.

5. A method as recited in claim 4 wherein said step of applying a signal to set each of the predefined shift register latches (SRLs) corresponding to said assigned predetermined identification number includes the step of:
   applying a selected logical zero or logical one functional data signal to a functional data input D of each predefined SRL; and
   applying a system clock signal to load said applied functional data signal into each predefined SRL.

6. A method as recited in claim 5 wherein each said SRL consists of a L1 latch and a L2 latch, said L2 latch coupled to said L1 latch and having a B clock signal applied for copying data from said L1 latch to said L2 latch, and said L1 latch including said functional data input D, said L1 latch having a SDI for receiving data from a previous SRL L2 latch in a scan ring and having an A clock signal applied for copying data from said L2 latch to said L1 latch and wherein the step of selectively reading out said stored predetermined identification number to identify the LSI chip includes the steps of:
   activating a scan gate signal for disabling said system clock signal;
   activating a B clock signal for copying said applied functional data signal from said L1 latch to said L2 latch; and
   sequentially activating a first A clock signal and a second B clock signal and sampling a chip scan data output signal with each said activated first A clock signal.

7. Apparatus for uniquely identifying large scale integrated (LSI) circuit chips of the type conforming to scan design systems and testing techniques and having a plurality of shift register latches storage elements forming a scan ring having a scan data input (SDI) and a scan data output (SDO) comprising:
   a plurality of predefined shift register latches (SRLs) of said scan ring for storing a unique predetermined identification number included in each LSI chip to be identified; said plurality of predefined shift register latches being located a predetermined number N of pad SRLs from said scan data output SDO; and
   means for selectively reading out said stored predetermined identification number to identify the LSI chip.

8. Apparatus as recited in claim 7 wherein said predetermined number N of pad SRLs is a selected integer greater than or equal to zero.

9. Apparatus as recited in claim 7 wherein each of said plurality of predefined shift register latches includes a functional data input D further comprising:
   means coupled to said functional data input D for providing a selected signal, said selected signal being either a logical one or a logical zero.

10. Apparatus as recited in claim 7 wherein said means for selectively reading out said stored predetermined identification number to identify the LSI chip include:
   means for detecting a predetermined number N of bit-shifts; said detected predetermined number N of bit-shifts corresponding to a predetermined number N of pad SRLs from said SDO, and
   means for identifying said stored predetermined identification number responsive to said detected number N bit-shifts.

11. Apparatus as recited in claim 7 wherein said plurality of predefined shift register latches store a first predetermined number L of bits for defining a chip ID number and a second predetermined number M of bits for defining a chip level ID number.

12. A method for uniquely identifying large scale integrated (LSI) circuit chips of the type conforming to scan design systems and testing techniques and having a plurality of shift register latches storage elements forming a scan ring having a scan data input (SDI) and a scan data output (SDO), said method comprising the steps of:
   storing a unique predetermined identification number in a plurality of predefined shift register latches (SRLs) of said scan ring included in each LSI chip to be identified; said plurality of predefined SRLs being located a predetermined number N of SRLs from said SDO, and
   selectively reading out said stored predetermined identification number to identify the LSI chip.

13. A method as recited in claim 12 wherein said step of selectively reading out said stored predetermined identification number to identify the LSI chip includes the steps of:
   detecting N bit-shifts corresponding to said predetermined number N of pad SRLs; and
   identifying said stored predetermined identification number responsive to said detected N bit-shifts.

* * * * *